US006259588B1

(12) United States Patent
Sample et al.

(10) Patent No.: US 6,259,588 B1
(45) Date of Patent: *Jul. 10, 2001

(54) INPUT/OUTPUT BUFFER WITH OVERCURRENT PROTECTION CIRCUIT

(75) Inventors: Stephen P. Sample, Saratoga, CA (US); Michael R. Butts, Portland, OR (US); Kevin A. Norman, Belmont; Rakesh H. Patel, Cupertino, both of CA (US)

(73) Assignees: Altera Corporation; Quickturn Design Systems, Inc., both of San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/474,795

(22) Filed: Dec. 29, 1999

Related U.S. Application Data

(63) Continuation of application No. 08/893,249, filed on Jul. 16, 1997, now Pat. No. 6,034,857.

(51) Int. Cl.[7] .................................................... H02H 3/00
(52) U.S. Cl. ................................................................ 361/93.2
(58) Field of Search ................................ 361/18, 57, 58, 361/87, 93.1, 93.2, 93.7, 93.9, 94, 98, 100, 101, 111, 119; 326/21, 37–41, 46, 47, 82, 93, 101

(56) References Cited

U.S. PATENT DOCUMENTS

| Re. 34,444 | 11/1993 | Kaplinsky | 326/39 |
|---|---|---|---|
| 4,293,783 | 10/1981 | Patil | 326/39 |
| 4,825,414 | 4/1989 | Kawata | 326/189 |
| 4,855,958 | 8/1989 | Ikeda | 365/230.08 |
| 4,884,165 | 11/1989 | Kong et al. | 361/98 |
| 4,893,280 | 1/1990 | Gelsomini et al. | 365/230.05 |
| 4,896,244 | 1/1990 | Kalina | 361/98 |
| 4,963,770 | 10/1990 | Keida | 326/39 |
| 4,975,601 | 12/1990 | Steele | 326/39 |
| 5,042,004 | 8/1991 | Agrawal et al. | 326/39 |
| 5,122,685 | 6/1992 | Chan et al. | 326/39 |

(List continued on next page.)

FOREIGN PATENT DOCUMENTS

| 0081917 | 8/1983 | (EP) | H03K/17/62 |
|---|---|---|---|
| 0 225 715 | 6/1987 | (EP) . | |
| 0410759 A2 | 1/1991 | (EP) | H03K/19/173 |
| 0415542 A2 | 3/1991 | (EP) | H03K/19/173 |
| 0420389 A1 | 4/1991 | (EP) | G11C/16/00 |
| 0507507 A2 | 10/1992 | (EP) | H03K/19/177 |

(List continued on next page.)

OTHER PUBLICATIONS

Masumoto, Rodney T., "Configurable On–Chip RAM Incorporated into High Speed Logic Array," IEEE Custom Integrated Circuits conference, Jun. 1985, CH2157–6/85/0000–0240, pp. 240–243.

Landry, Steve, "Application–Specific ICs, Relying on RAM, Implement Almost Any Logic Function," Electronic Design, Oct. 31, 1985, pp. 123–130.

Bursky, Dave, "Shrink Systems with One–chip Decoder, EPROM, and RAM," Electronic Design, Jul. 28, 1988, pp. 91–94.

(List continued on next page.)

Primary Examiner—Ronald W. Leja
(74) Attorney, Agent, or Firm—Lyon & Lyon LLP

(57) ABSTRACT

An overcurrent protection circuit for input/Output (I/O) buffers for a Field Programmable Gate Array wherein short circuits can be detected and the output current limited so as to avoid damaging the device. I/O buffers having the overcurrent protection circuit can detect a contention between the buffers. In order to eliminate the contention, certain I/O buffers will go into a noncontending state.

11 Claims, 2 Drawing Sheets

U.S. PATENT DOCUMENTS

| | | | |
|---|---|---|---|
| 5,212,666 | 5/1993 | Takeda | 395/425 |
| 5,231,312 | 7/1993 | Gongwer et al. | 307/465 |
| 5,276,842 | 1/1994 | Sugita | 395/425 |
| 5,313,119 | 5/1994 | Cooke et al. | 326/39 |
| 5,315,178 | 5/1994 | Snider | 326/39 |
| 5,329,460 | 7/1994 | Agrawal et al. | 364/489 |
| 5,329,493 | 7/1994 | Meyer et al. | 365/230.01 |
| 5,343,406 | 8/1994 | Freeman et al. | 326/39 |
| 5,352,940 | 10/1994 | Watson | 326/39 |
| 5,375,089 | 12/1994 | Lo | 365/189.04 |
| 5,384,500 | 1/1995 | Hawes et al. | 326/39 |
| 5,386,155 | 1/1995 | Steele et al. | 326/37 |
| 5,408,434 | 4/1995 | Stansfield | 326/44 |
| 5,412,260 | 5/1995 | Tsui et al. | 326/39 |
| 5,414,377 | 5/1995 | Freidin | 326/41 |
| 5,426,378 | 6/1995 | Ong | 326/39 |
| 5,530,670 | 6/1996 | Matsumoto | 365/189.01 |
| 5,550,782 | 8/1996 | Cliff et al. | 326/40 |
| 5,566,123 | 10/1996 | Freidin et al. | 326/38 |
| 5,572,148 | 11/1996 | Lytle et al. | 326/41 |
| 5,596,742 | 1/1997 | Agarwal et al. | 395/500 |
| 5,668,771 | 9/1997 | Cliff et al. | 369/47 |
| 5,717,901 | 2/1998 | Sung et al. | 395/497.01 |
| 5,796,267 | 8/1998 | Pederson | 326/39 |
| 5,809,281 | 9/1998 | Steele et al. | 326/39 |
| 5,835,405 | 11/1998 | Tsui et al. | 365/182 |
| 5,852,608 | 12/1998 | Csoppenszky et al. | 365/230.05 |

FOREIGN PATENT DOCUMENTS

| | | |
|---|---|---|
| 0530985 A2 | 3/1993 | (EP) . |
| 0569137 A2 | 11/1993 | (EP) . |
| 01091525 | 4/1989 | (JP) ............ H03K/19/173 |
| 01091526 | 4/1989 | (JP) ............ H03K/19/177 |
| 95/15152 | 9/1992 | (WO) ........... H03K/19/173 |
| WO 94/10754 | 5/1994 | (WO) . |

OTHER PUBLICATIONS

Kawana, Keiichi et al., "An Efficient Logic Block Interconnect Architecture for User–Reprogrammable Gate Array," IEEE 1990 Custom Integrated Circuits Conf., May 1990, CH2860–5/90/0000–0164, pp. 31.3.1 to 31.3.4.

Shubat, Alexander et al., "A Family of User–Programmable Peripherals with a Functional Unit Architecture," IEEE Jor. of Solid–State Circuits, vol. 27, No. 4, Apr. 1992, 0018–9200/92403.00, pp. 515–529.

"AT&Ts Orthogonal ORCA Targets the FPGA Future," 8029 Electronic Engineering, 64, No. 786, Jun. 1992, pp. 9–10.

Burskey, Dave, "FPGA Advances Cut Delays, Add Flexibility," 2328 Electronic Design, 40, No. 20, Oct. 1, 1992, pp. 35–43.

Smith, Daniel, "Intel's FLEXlogic FPGA Architecture," IEEE 1063–6390/93, 1993 pp. 378–384 No Month.

Bursky, Dave, "Denser, Faster FPGAs Vie for Gate–Array applications," 2328 Electronic Design, 41, No. 11, May 27, 1993, pp. 55–75.

Ngai, Kai–Kit Tony, "An SRAM–Programmable Field–Reconfigurable Memory," University of Toronto, Canada, Jun. 1994, UMI Dissertation Services, pp. 1–68.

Kautz, "Cellular Logic in Memory Arrays," IEEE Trans on Computers, vol. C–18, No. 8, Aug. 1969, pp. 719–727.

Stone, "A Logic in Memory Computer," IEEE Trans. on Computers, Jan. 1970, pp. 73–78.

Manning, "An Approach to Highly Integrated Computer Maintained Cellular Arrays," IEEE Trans. on Computers, vol. C–26, No. 67, Jun. 1977, pp. 536–552.

Patil et al., "A Programmable Logic Approach for VLSI," IEEE Trans. on Computers, vol. C–28, No. 9, Sep. 1979, pp. 594–601.

Seitz, "Concurrent VLSI Architectures," IEEE Trans. on Computers, vol. C–33, No. 12, Dec. 1984, pp. 1247–1265.

Hsieh et al., "Third Generation Architecture Boosts Speed and Density of Field Programmable Gate Arrays," Proc. of IEEE CICC Conf., May 1990, pp. 31.2.1 to 31.2.7.

Bursky, "Combination RAM/PLD Opens New Application Options," Electronic Design, May 23, 1991, pp. 138–140.

Ling et al., "WASMII: A Data Driven Computer on a Virtual Hardware," Proc. of IEEE Field Prog. Custom Computing Machines Conf., Napa, California, Apr. 1993, pp. 33–42.

Casselman, "Virtual Computing and The Virtual Computer," IEEE, Jul. 1993, p. 43.

Quenot et al., "A Reconfigurable Compute Engine for Real–Time Vision Automata Prototyping," Proc. of IEEE FCCM Conf., Napa, California, Feb. 1994, pp. 91–100.

Plus Logic "FPSL5110 Intelligent Data Buffer" Product Brief, Plus Logic, Inc., San Jose, California, Oct. 1990, pp. 1–6.

Intel Preliminary Datasheet, "iFX780: 10ns FLEXlogic FPGA with SRAM Option," Nov. 1993, pp. 2–24 to 2–46.

Quinnell, Richard A., "FPA Family Offers Speed, Density, On–chip RAM, and Wide–Decode Logic," EDN Dec. 6, 1990, pp. 62–63.

Satoh, Hisayasu et al., "A 209K–Transistor ECL Gate Array with RAM," IEEE Jor. of Solid–State Circuits, vol. 24, No. 5, Oct. 1989, pp. 1275–1279.

Schematic of a Tristate Input/Output Buffer with Input/Output protection used in Quickturn's Enterprise System 1992 No Month.

Bursky, Dave, "Combination RAM/PLD Opens New Application Options", May 23, 1991 (2 pgs.).

Altera Brochure, 1995Data Book, Flex 8000 Programmable Logic Device Family, pp. 52–55, No Month.

INPUT/OUTPUT BUFFER WITH OVERCURRENT PROTECTION CIRCUIT

This is a continuation of application Ser. No. 08/893,249 filed Jul. 16 1997, and which issued as U.S. Pat. No. 6,034,857 on Mar. 7, 2000.

FIELD OF THE INVENTION

The present invention relates in general to input/output (I/O) buffers for an integrated circuit, and specifically provides for an overcurrent protection circuit which can be incorporated with an I/O buffer for a Field Programmable Gate Array (FPGA) wherein short circuits can be detected and the output current limited so as to avoid damaging the device. I/O buffers constructed in accordance with the present overcurrent protection circuit are also applicable to hardware logic emulation systems which utilize multiple FPGAs as well as chips other than FPGAs.

BACKGROUND OF THE INVENTION

I/O buffers are used to drive the external pins of integrated circuits. In general, I/O buffers must be capable of sourcing and sinking large amounts of current in order to meet standard specifications and to drive capacitive loads quickly. However, if an I/O pin were to become shorted either to ground, a voltage supply or another pin for more than a few tenths of a second, the integrated circuit may be irreversibly damaged.

If the integrated circuit is a field programmable gate array (FPGA) which can be programmed to implement a wide variety of logic circuit designs, the problem is particularly severe because short circuits may be caused simply by loading the wrong device configuration pattern. The most common failure in an FPGA arises from "pin contention," where two or more driver circuits are each driving the same board trace but one (or more) is (are) driving a logic high while the other(s) is (are) driving a logic low. If this condition lasts only a few tens of microseconds, there will not be any harm done. However, if the condition persists for several milliseconds, the temperature of the I/O buffer rises to a dangerous level and parasitic bipolar circuit elements in the I/O buffer may begin to conduct. If one of these parasitic bipolar elements goes into second bipolar breakdown (current hogging) then the concentration of power dissipation in a very small region results in permanent thermal damage to the I/O buffer.

Therefore, while it is desirable to be able to limit current, most I/O buffers do not do so because of the difficulty in directly measuring current through a CMOS transistor.

It is accordingly an object of this invention to provide an indirect yet simple method of detecting an overcurrent condition by comparing input and output voltage levels and limit output current accordingly.

It is a further object of this invention to determine if an overcurrent error condition exists by monitoring this overcurrent detection for a predetermined period of time, with or without the use of an external clock signal.

It is a further object of this invention to provide a mechanism for limiting the output current if the overcurrent error condition exists.

It is still further an object of this invention to provide a means of controlling the overcurrent circuitry and signaling the occurrence of an overcurrent error condition.

SUMMARY OF THE INVENTION

These and other objects of the present invention are achieved with an overcurrent protection circuit which indirectly detects an overcurrent condition by comparing the voltage on a pin to the logic level which the I/O buffer is trying to drive. If the two levels are different for more than a predetermined time, thus signifying an overcurrent error condition, then the large primary output driver is turned off to limit the output current. A small secondary driver remains on so that the correct logic level will be restored when the short is removed. When a short is detected, a latch is set which can be read through a JTAG port to determine the location of the short. An interrupt signal is also generated to alert the user that a short has occurred. FPGAs have not yet incorporated such overcurrent protection circuits.

BRIEF DESCRIPTION OF THE DRAWINGS

The invention is illustrated in the accompanying drawings in which.

DETAILED DESCRIPTION OF THE SPECIFIC EMBODIMENTS

With reference to the figures, a detailed description of preferred embodiment of the present invention is provided.

Figure 1:
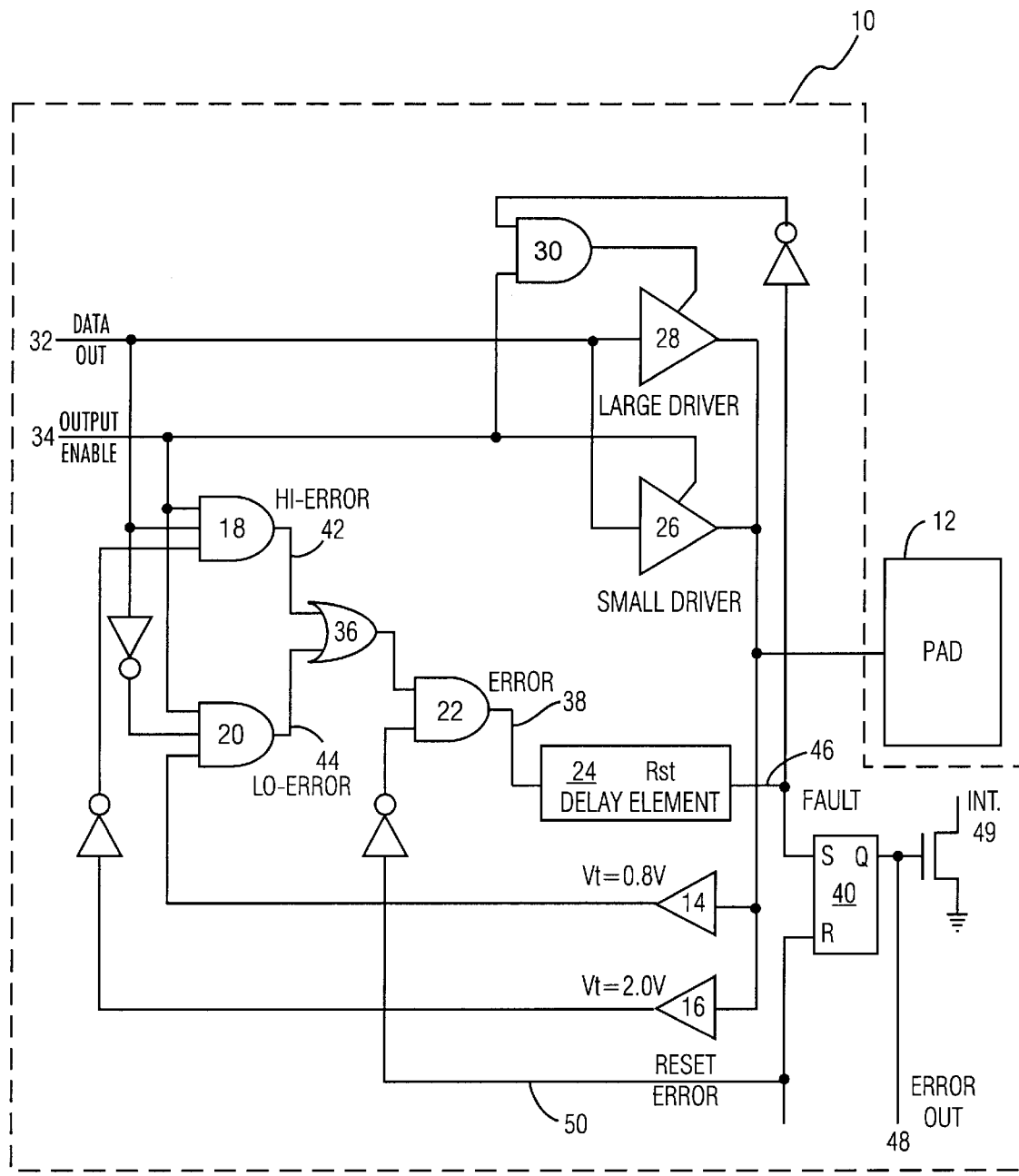
FIG. 1 is an electrical schematic drawing of an I/O buffer incorporating an overcurrent protection circuit.

FIG. 1 illustrates a schematic drawing of an I/O buffer circuit incorporating an overcurrent protection circuit, which is comprised of four basic sections.

1) The first section is the overcurrent detection section which detects an overcurrent condition by comparing the voltage on I/O pad 12 to the logic level on Data Out signal 32 which the I/O buffer is trying to drive.

Figure 2:
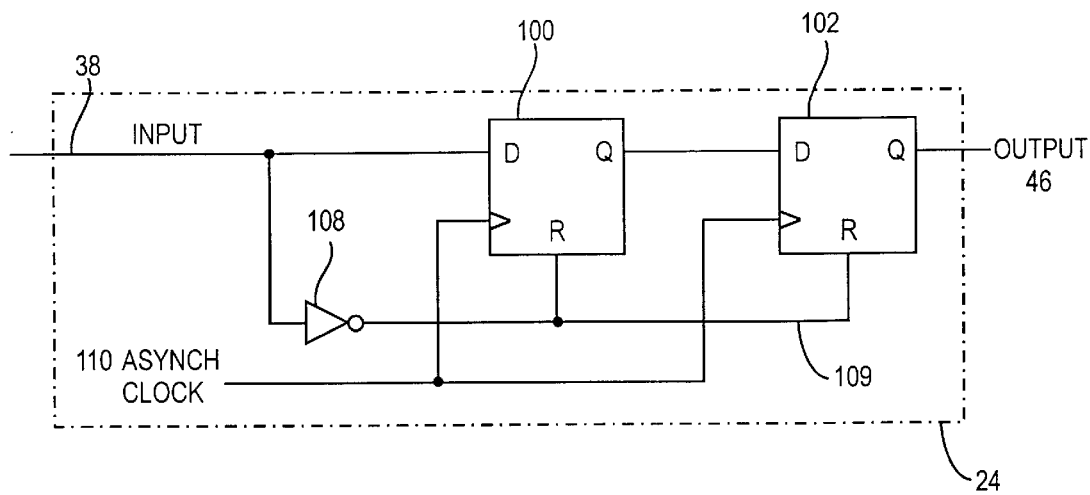
FIG. 2 is a schematic drawing of a clocked resetable delay element.
Figure 3:
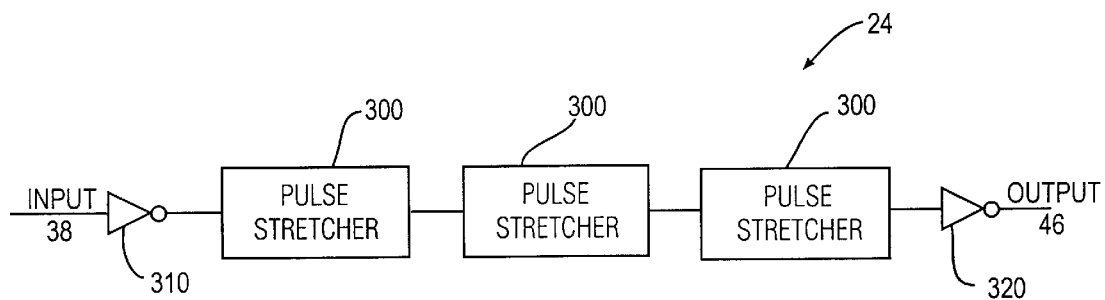
FIG. 3 is a block diagram of an unclocked resetable delay element comprised of one or more pulse stretching circuits.

2) The second section is a Resetable Delay Element 24 which monitors the detection of an overcurrent condition for a period of time to see if the voltage difference constitutes an overcurrent error condition or is simply due to capacitive charging and discharging of the trace attached to physical I/O pad 12. Two different Resetable Delay Elements are illustrated in FIGS. 2 and 3, one of which (FIG. 2) utilizes an asynchronous clock pulse.

3) The third section provides for a mechanism to limit the output current if an overcurrent error condition exists.

4) Finally, the fourth section provides for a means to control the overcurrent error condition and signal the occurrence of an overcurrent error condition.

Referring now to FIG. 1, the first section of the overcurrent protection circuit will now be described in greater detail. FIG. 1 illustrates overcurrent protection circuit 10 which is shown in connection to physical I/O pad 12. Overcurrent protection circuit 10 is intended to be included as part of the I/O buffer for each I/O pin on the FPGA (or any integrated circuit). Although only one overcurrent protection circuit 10 is shown in FIG. 1, it should be understood that a typical FPGA will contain as many I/O buffers as there are FPGA I/O pads and will therefore have an equal number of overprotection circuits, one associated with each I/O buffer. Moreover, the overcurrent protection circuit may be implemented in either input/output buffers or output buffers.

Overcurrent protection circuit 10 indirectly measures output current by comparing the voltage on physical I/O pad 12 to the Data Out signal 32 which the I/O buffer is trying to drive. This measurement is accomplished by utilizing two sense amplifiers 14 and 16 whose outputs are used to generate either Hi-Error signal 42 or Lo-Error signal 44. More specifically, sense amplifier 14 (marked Vt=0.8V) produces a high level when the voltage on I/O pad 12 is above 0.8 volts or any other predetermined threshold voltage; and sense amplifier 16 (marked Vt=2.0V) produces a high level when the voltage on I/O pad 12 is above 2.0 volts or any other predetermined threshold voltage. Sense amplifiers 14 and 16 may also be used to provide input data to the chip corresponding to TTL and CMOS input levels respectively.

Hi-Error 42 signal is produced when the Output Enable signal 34 is high, Data Out signal 32 is high and the signal from sense amplifier 16 (marked Vt=2.0 V) signal is low. This condition occurs when the I/O buffer is attempting to drive a high level, but the voltage on I/O pad 12 remains below 2.0 volts (or any other predetermined threshold voltage).

Similarly, Lo-Error signal 44 is produced when the Output Enable signal is high, Data Out signal 32 is low and the signal from sense amplifier 14 (marked Vt=0.8 V) signal is high. This condition occurs when the I/O buffer is attempting to drive a low level, but the voltage on I/O pad 12 remains above 0.8 volts (or any other predetermined threshold voltage).

The preferred embodiment has two input sense amplifiers 14 and 16 with different threshold voltages so that if a short occurs between two I/O buffers which incorporate overcurrent protection circuits, the short will be detected by both buffers. During a contention between buffers, the buffers may be of three possible types: (1) those which drive high (i.e., drives a high level voltage), (2) those which drive low and (3) those not driving. When buffers contend, it is sufficient for the all of the members of either the first group (those driving high) or the second group (those driving low) capitulate; that is, to go to tristate. In order to tame the power dissipating anomaly caused by the contention, it is sufficient for all members of one group to capitulate and it is unnecessary for any members of the other group to capitulate. Thus, for example, in the case of two contending buffers, one buffer will detect the error first, go into a noncontending state and allow the remaining driver to remain in the high drive state (i.e., drives a high level voltage). As a further example, in the two buffer situation where one buffer drives high and another buffer drives low, one of these contending buffers can detect the error first and move to the low drive state. With only a low drive present, the high drive buffer will not detect anything askance. Both buffers will survive the contention even if only one buffer backs down. As yet another example, for more than two contending buffers, when all but one of the buffers go to a low drive state, the remaining buffer will stay in a high drive state without adverse consequences.

Referring back to FIG. 1, Hi-Error signal 42 and Lo-Error signal 44 are first combined together using OR gate 36 and then gated through AND gate 22 along with the inverse of Reset Error signal 50. The output of AND gate 22 produces Error signal 38 which goes high when either Hi-Error signal 42 or Lo-Error signal 44 has been detected. Error signal 38 is then input into the second section of the overcurrent protection circuit, Resetable Delay Element 24.

As discussed previously, Resetable Delay Element 24 ensures that Error signal 38 persists for at least tens of nanoseconds to produce an overcurrent error condition 46. Short false errors occur whenever the output changes value because of the time delay for the I/O buffer to charge and discharge capacitance on I/O pad 12. Short false errors may also occur because of electrical noise on the printed circuit trace attached to I/O pad 12. It is important that these short false errors not be detected as overcurrent error conditions. The I/O buffer will not be permanently damaged unless the actual overcurrent condition persists for at least several tenths of a second. Two types of Resetable Delay Elements are shown in FIGS. 2 and 3.

FIG. 2 shows a clocked Resetable Delay Element which may be constructed using two flip-flops 100 and 102 and an asynchronous clock signal 110. If Error input signal 38 persists at a high level for at least one complete clock period, then Output signal 46 will go high, signifying the occurrence of an overcurrent error condition. If Error input signal 38 goes low momentarily before one complete clock period has elapsed, Reset signal 109 produced by inverter 108 will go high and reset flip-flops 100 and 102, thus starting the process over. The overall time delay may be easily adjusted by either controlling the frequency of asynchronous clock pulse 110 or increasing the number of flip-flops in series beyond the two shown in FIG. 2.

Figure 4:
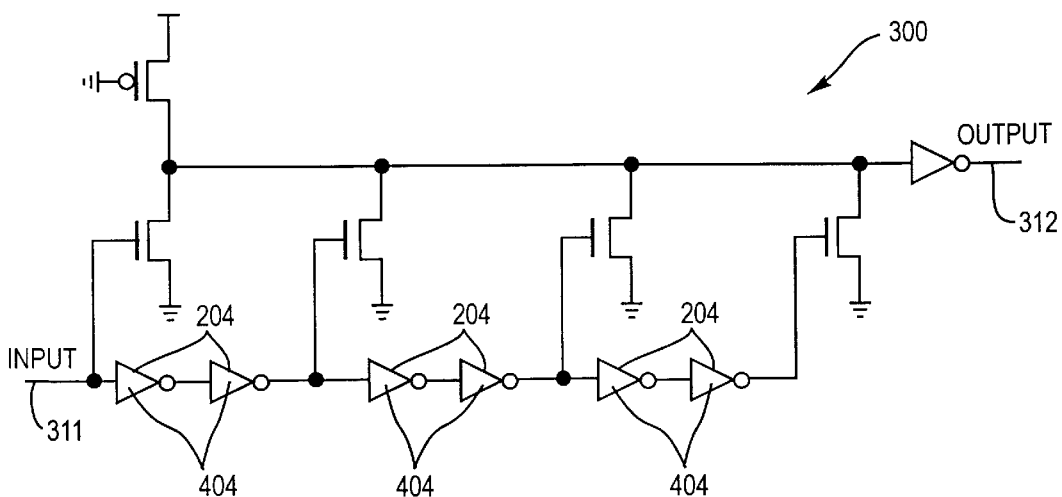
FIG. 4 is a schematic drawing of a pulse stretching circuit as diagrammed in FIG. 3.

FIG. 3 illustrates a Resetable Delay Element constructed without the use of an asynchronous clock by using a series of pulse stretching circuits. These pulse stretching circuits, one of which is illustrated in FIG. 4, will cause a short high level pulse on input signal 311 to be stretched into a longer high level pulse on output 312. If input signal 311 has been at a high level for a period of time, brief low level pulses on input signal 311 will have no effect on output signal 312. Output signal 312 will only go low if input signal 311 remains low long enough to propagate completely through the chain of inverters. Such a pulse stretching circuit may achieve longer delays by utilizing pullup transistors with a smaller width/length ratio for constructing the chain of inverters 404.

Referring to FIG. 3, by using one or more of pulse stretching circuits 300 in sequence with successively longer delays, pulses may be stretched to any arbitrary length. By inverting the input and output to this sequence of pulse stretchers 300 using inverters 310 and 320, an appropriate Resetable Delay Element 24 with a desired delay may produced. Because input signal 38 must stay high for a long period in order to propagate to output 46, delays up to several hundred microseconds may be easily produced. The unclocked circuit shown here does not require an asynchronous clock, but uses more transistors than the circuit shown in FIG. 2 and has a delay that cannot be as easily adjusted. One skilled in the art could construct other forms of resettable delay elements.

Referring back to FIG. 1, when an overcurrent condition is detected and verified, the current through the I/O buffer must be limited in order to prevent permanent damage. This is achieved by the third section of the overcurrent protection circuit, which divides the Data Out signal 32 into two output drivers 26 and 28. The large primary driver 28 provides enough current to rapidly switch from one signal level to another and to meet any required direct current specifications. The small secondary driver 26 provides enough current to restore a signal to the correct level after a fault has been removed, but small driver 26 cannot provide enough current to damage the part. Typically, small driver 26 would produce a maximum current of a few tens of milliamperes under a short circuit condition.

The control input to small driver 26 is directly connected to Output Enable signal 34, whereas the large driver 28 is gated through AND gate 30 by the inverse of overcurrent error condition signal 46 (Fault) and Output Enable signal 34.

When an overcurrent error condition occurs, the fourth section of the overcurrent protection circuit provides for controlling the current and signaling which pin caused the problem so the PC board or the FPGA design can be corrected. This is achieved by setting latch 40. Latch 40 produces Error out signal 48 which can be later read over the JTAG bus. Latch 40 is reset by Reset Error signal 50 which is produced by the chip after the JTAG read is complete. Overcurrent error condition 46 also produces the open-collector Int signal 49 which is common to all I/O pins. This is used to inform the system that some pin has experienced an overcurrent error condition and that the operating results may not be correct.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed. For instance, even though the invention has been described with reference to a tristate output buffer, the invention could be adapted for other forms of input/output buffers such as bidirectional, output only, open-collector or open-emitter without departing from the spirit and scope of the invention.

We claim:

1. An field programmable gate array for implementing reconfigurable logic comprising:

a physical pad which transfers signals out of the field programmable gate array;

an output buffer that drives signals at a first logic level or a second logic level and outputting a current;

a clocked resetable delay element that determines a threshold amount of time;

an overcurrent error detection circuit that compares the voltage level on the pad in the field programmable gate array with the voltage level being driven by the output buffer in order to detect an overcurrent error condition, and when the voltage level on the pad is not the same voltage level as the voltage level being driven by the output buffer for an amount of time greater than the threshold time determined by the clocked resetable delay element, the overcurrent error detection circuit determines that an overcurrent error condition exists;

an overcurrent protection circuit responsive to the overcurrent error detection circuit where the overcurrent protection circuit protects the field programmable gate array by limiting the current when the overcurrent error condition exists.

2. The field programmable gate array of claim 1 further comprising:

a first circuit that drives a first signal at the first logic level;

a second circuit that drives a second signal at the second logic level;

wherein the overcurrent error detection circuit compares the first logic level being driven by the first circuit against the second logic level being driven by the second circuit and determines that an overcurrent error condition exists if the first logic level being driven by the first circuit is a different level from the second logic level being driven by the second circuit for an amount of time greater than the threshold time determined by the clocked resetable delay element.

3. The field programmable gate array of claim 2 wherein the threshold time is set to a predetermined amount of time.

4. The field programmable gate array of claim 1 wherein the overcurrent protection circuit further comprises:

a first driver and second driver, each of the drivers having an input and output; and a plurality of logic gates.

5. The field programmable gate array of claim 4 wherein the overcurrent error detection circuit further comprises a first sense amplifier and second sense amplifier, each of the amplifiers having an input and output.

6. The field programmable gate array of claim 5 wherein the first and second sense amplifiers have different threshold voltages.

7. The field programmable gate array of claim 1 wherein the output buffer includes an input buffer.

8. The field programmable gate array of claim 1 wherein the output buffer is a bidirectional buffer.

9. The field programmable gate array of claim 1 wherein the output buffer is an open-collector buffer.

10. The field programmable gate array of claim 1 wherein the output buffer is an open-emitter buffer.

11. The field programmable gate array of claim 1 wherein the clocked resetable delay element uses an asynchronous clock signal.

* * * * *